United States Patent [19]
Katayama et al.

[11] Patent Number: 5,410,164
[45] Date of Patent: Apr. 25, 1995

[54] DISPLAY ELECTRODE SUBSTRATE

[75] Inventors: Mikio Katayama, Ikoma; Yuzuru Kanemori, Tenri; Hirohisa Tanaka; Hiroshi Morimoto, both of Nara; Hidenori Negoto, Ikoma, all of Japan

[73] Assignee: Sharp Kabushimi Kaisha, Osaka, Japan

[21] Appl. No.: 816,856

[22] Filed: Jan. 2, 1992

Related U.S. Application Data

[63] Continuation of Ser. No. 465,739, Jan. 18, 1990, abandoned.

[30] Foreign Application Priority Data

Jan. 18, 1989 [JP] Japan ................................. 1-10642

[51] Int. Cl.$^6$ ................... H01L 27/01; H01L 27/13; H01L 29/78
[52] U.S. Cl. ........................................ 257/59; 257/72; 359/59
[58] Field of Search ................... 357/23.7; 350/332 R, 350/334, 336; 359/59; 257/59, 72

[56] References Cited

U.S. PATENT DOCUMENTS

| | | | |
|---|---|---|---|
| 4,762,398 | 8/1988 | Yasui et al. | 350/334 |
| 4,775,861 | 10/1988 | Saito | 340/784 |
| 4,894,690 | 1/1990 | Okabe et al. | 357/23.7 X |
| 4,907,861 | 3/1990 | Muto | 350/334 X |
| 4,917,467 | 4/1990 | Chen et al. | 350/332 |
| 4,930,874 | 6/1990 | Mitsumune et al. | 350/336 X |
| 4,938,565 | 7/1990 | Ichikawa | 350/333 X |

FOREIGN PATENT DOCUMENTS

| | | |
|---|---|---|
| 0182645 | 5/1986 | European Pat. Off. |
| 0259875 | 3/1988 | European Pat. Off. |
| 62-135814 | 6/1987 | Japan . |
| 62-145218 | 6/1987 | Japan . |
| 61-174508 | 8/1988 | Japan ................................. 359/59 |
| 2206721 | 1/1989 | United Kingdom . |

Primary Examiner—Sara W. Crane
Attorney, Agent, or Firm—Morrison & Foerster

[57] ABSTRACT

A display electrode substrate comprising at least two, first and second, TFTs connected in series to each picture element, wherein the first and second thin film transistors are Juxtaposed on the same one of the gate bus lines, part of the gate bus line functions as gate electrodes of the first and second thin film transistors, a source electrode of the first thin film transistor is connected to the source bus line, a drain electrode of the first thin film transistor is connected to a source electrode of the second thin film transistor, and a drain electrode of the second thin film transistor is connected to the picture element electrode, whereby a picture element defect caused by a short-circuit defect of the TFTs can be reduced.

2 Claims, 6 Drawing Sheets

FIG. 5
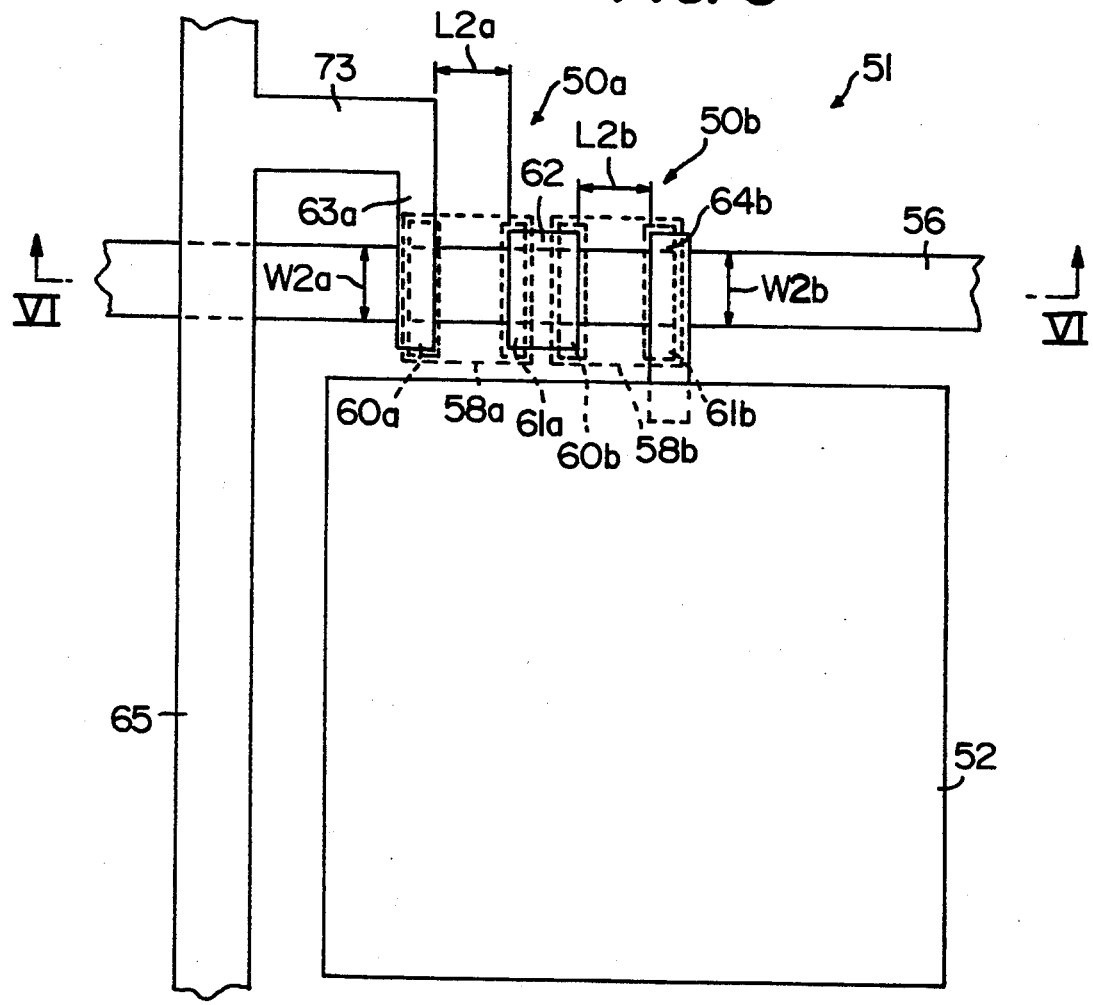
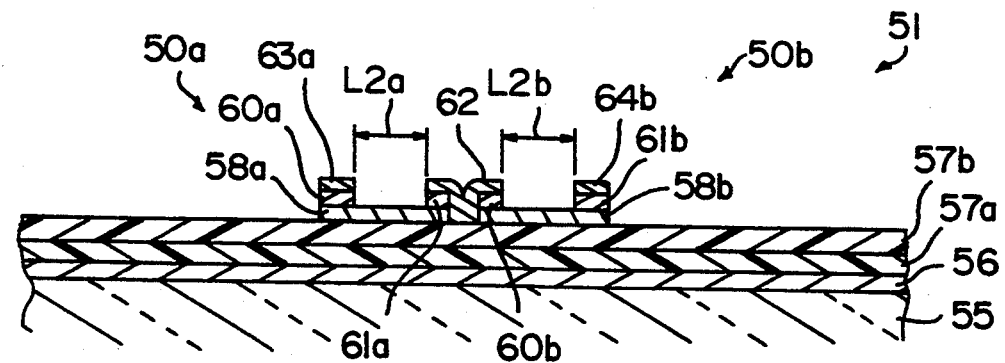
FIG. 6

DISPLAY ELECTRODE SUBSTRATE

This application is a continuation of application Ser. No. 07/465,739, filed 18 Jan. 1990, now abandoned.

BACKGROUND OF THE INVENTION

1. Field of the Invention

The present invention relates to a display electrode substrate that is suitable for use in an active matrix display apparatus.

2. Description of the Prior Art

FIG. 9 is a plan view of a conventional display electrode substrate used for an active matrix liquid crystal display apparatus, showing a structure of the substrate per one picture element, and FIG. 10 is a sectional view taken on the line X—X in FIG. 9, wherein on a transparent insulating substrate 1 is formed a gate bus line 2 as a scanning line for the active matrix liquid crystal display apparatus, and part of the gate bus line 2 functions as a gate electrode of a thin film transistor (TFT) 8. A gate insulating film 3a of tantalum oxide ($Ta_2O_5$) coats the gate bus line 2. A gate insulating film 3b is disposed throughout the surface of substrate 1 including the gate insulating film 3a.

A semiconductor layer 4 made of intrinsic amorphous silicon or the like is disposed at a position on the gate insulating film 3b that corresponds to the gate bus line 2. Semiconductor layers 4a and 4b made of n-type amorphous silicon or the like are selectively disposed on parts of the semiconductor layer 4. Also, the semiconductor layer 4 is a channel layer of TFT 8. On the gate insulating film 3b are integrally disposed a source bus line 5 and a source electrode 5a functioning as the signal lines at the active matrix liquid crystal display apparatus. The source bus line 5 is disposed to perpendicularly solid-cross with the gate bus line 2 so as to sandwich the gate insulating film 3b therebetween. The source electrode 5a is superposed on a lateral side of the semiconductor layer 4. A drain electrode 6 is disposed on the gate insulating film 3b in such a manner that part of the drain electrode 6 is disposed on the other side of the semiconductor layer 4.

Moreover, on the gate insulating film 3b is disposed a picture element electrode 7 made of a transparent conductive film and having an area corresponding to one picture element, the picture element electrode 7 being disposed on part of the drain electrode 6 to be electrically connected therewith.

The gate bus line 2, gate insulating films 3a and 3b, semiconductor layers 4, 4a and 4b, source electrode 5a and drain electrode 6 constitute the TFT 8. The TFT 8 functions as a switching element corresponding to one picture element at the active matrix liquid crystal display apparatus. The electrical characteristics of TFT 8 depend upon the width W1 of source electrode 5a and drain electrode 6 and the distance (channel length) L1 between the source electrode 5a and the drain electrode 6.

The TFT 8 and the picture element electrode 7 are disposed at every intersection of the gate bus line 2 and source bus line 5, in other words, as many as the number of picture elements disposed in a matrix form. A liquid crystal layer is sandwiched between the display electrode substrate thus formed and an opposite substrate on which the opposite electrode is disposed, thereby constituting a transparent type active matrix liquid crystal display apparatus.

The number of TFT 8 formed on the aforesaid display electrode substrate depends upon the number of picture elements. For example, for the liquid crystal display apparatus of 400×64 dots, 256000 TFTs 8 must be disposed in a matrix form. With the display electrode substrate having]such numerous TFTs 8, if even one TFT 8 among them causes a malfunction, the picture element corresponding to the defective TFT 8 becomes defective, so that the display quality of the liquid crystal display apparatus lowers. Accordingly, the entire numerous TFT 8 must be formed without any defect.

However, the process for producing the display electrode substrate is complicated as mentioned above, so that it is difficult to form numerous TFTs 8 on the insulating substrate of a large area without defects, which makes it lower the production yield of the display electrode substrate.

As an approach for improving the production yield of the display electrode substrate, it has been proposed to provide two or more TFTs 8 per picture element so as to produce a redundant structure.

FIG. 11 is a plan view of the display electrode substrate of a redundant structure, showing a construction per a picture element, in which the components corresponding to those in FIG. 10 are designated with the same reference numerals.

The display electrode substrate is provided with a TFT 18 in addition to the TFT 8, corresponding to each picture element electrode 7, the TFT 18 being patterned simultaneously with the TFT 8 in the aforesaid manufacturing process for the display electrode substrate. Accordingly, the TFT 18 is constituted of the bus line 2, semiconductor layers 14, 14a and 14b, source electrode 5b and drain electrode 16.

The source electrode 5b at the TFT 18 is integrally disposed with the source bus line 5 and source electrode 5a, a portion of the source electrode 5b being disposed on one side of the semiconductor layer 14. A picture element electrode is disposed on one end of the drain electrode 16, the other end of the drain electrode 16 overlapping the other side of the semiconductor layer 14.

In the display electrode substrate, even when, for example, one of a plurality of TFTs 8 and 18 causes a disconnection that no current flows between the source electrode and the drain electrode although the gate electrode is switched on, so far as the remaining TFTs are in a normal state, the picture element normally operates, thus being effective to a disconnection of the TFT.

When two or more TFTs 8 and 18 are provided per one picture element as mentioned above, they are effective for a disconnection. However, since the number of TFT increases, the frequency of occurrence of the defect caused by short-circuit between the source electrode and the drain electrode at a TFT (to be hereinafter called the short-circuit defect) increases with an increase in the number of TFTs. Therefore, additional work is required to inspect the occurrence of short-circuit in the TFT so as to disconnect the short-circuited TFT from the picture element electrode.

SUMMARY OF THE INVENTION

The display electrode substrate of this invention, which overcomes the above-discussed and numerous other disadvantages and deficiencies of the prior art, comprises a large number of picture element electrodes disposed in a matrix form on an insulating substrate, at least two, first and second, thin film transistors connected to each of said picture element electrodes, gate bus lines provided in parallel to each other between said picture element electrodes, and source bus lines intersecting with said gate bus lines respectively, wherein said first and second thin film transistors are juxtaposed on the same one of said gate bus lines, part of said gate bus line functions as gate electrodes of said first and second thin film transistors, a source electrode of said first thin film transistor is connected to said source bus line, a drain electrode of said first thin film transistor is connected to a source electrode of said second thin film transistor, and a drain electrode of said second thin film transistor is connected to said picture element electrode.

In a preferred embodiment, the source electrodes and drain electrodes at said first and second thin film transistors are positioned reversely to each other with respect to said gate bus wiring, the channel directions of said first and second thin film transistors being perpendicular to the extending direction of said gate bus line.

In a preferred embodiment, the source electrode and drain electrode at each of said first and second thin film transistors are positioned in the extending direction of said gate bus wiring, the channel directions of said first and second thin film transistors being parallel to the extending direction of said gate bus line. The drain electrode at said first thin film transistor and said source electrode at said second thin film transistor are positioned adjacently to each other on said gate bus line. Alternatively, the drain electrode at said first thin film transistor and said drain electrode at said second thin film transistor are positioned adjacently to each other on said gate bus line.

According to the present invention, since a plurality of TFTs are connected in series to each picture element, even when some of these TFTs cause a short-circuit defect, the remaining TFTs that are normally operable can supply the electric charge to the corresponding picture element electrode and the electric charge is stored in the capacitor.

Thus, the invention described herein makes possible the objective of providing a display electrode substrate that can reduce a picture element defect caused by a short-circuit defect of the TFTs.

BRIEF DESCRIPTION OF THE DRAWINGS

This invention may be better understood and its numerous objects and advantages will become apparent to those skilled in the art by reference to the accompanying drawings as follows:

FIG. 5 is a plan view showing a portion of another display electrode substrate of the present invention.

FIG. 6 is a sectional view taken along the line VI—VI of FIG. 5.

DESCRIPTION OF THE PREFERRED EMBODIMENTS

EXAMPLE 1

Figure 1:
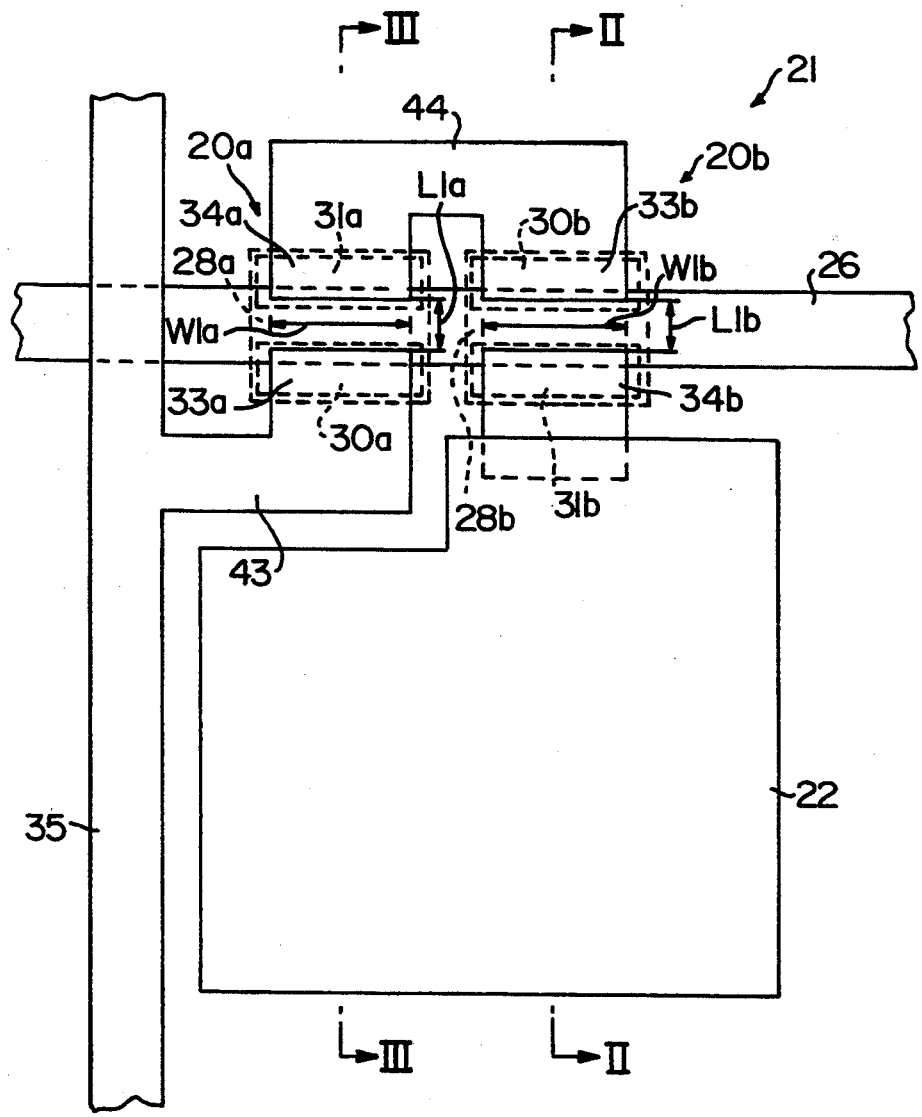
FIG. 1 is a plan view showing a portion of a display electrode substrate of the present invention.
Figure 2:
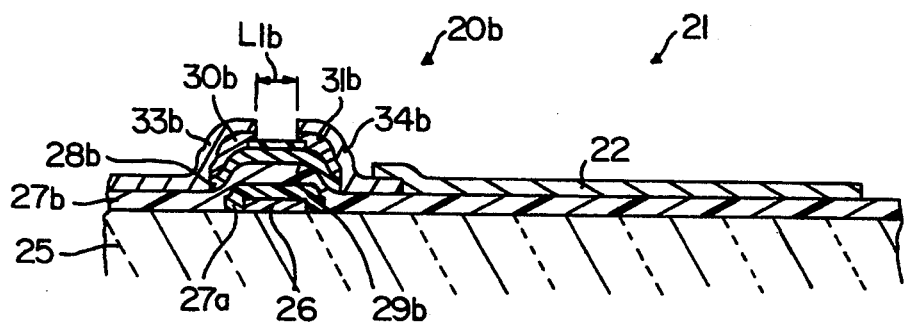
FIG. 2 is a sectional view taken along the line II—II of FIG. 1.
Figure 3:
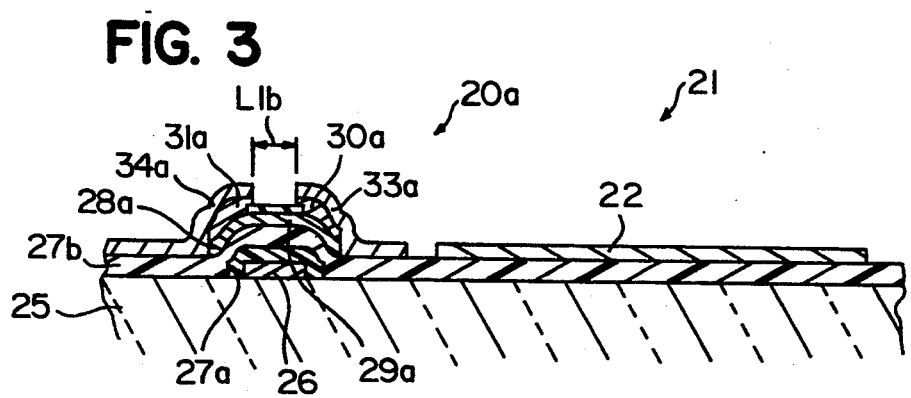
FIG. 3 is a sectional view taken along the line III—III of FIG. 1.

FIG. 1 shows a display electrode substrate 21 of the invention used for an active matrix display apparatus, in which a plurality of picture element electrodes 22 made of, for example, transparent ITO (indium tin oxide) or $SnO_2$ are disposed in a matrix form. Each picture element electrode 22 is provided with first and second TFTs 20a and 20b, which are disposed in series as discussed below. As shown in FIGS. 2 and 3, on a glass substrate 25 is patterned a gate bus line 26 made of a metal material, such as tantalum, aluminum, molybdenum, titanium, chromium or tungsten. The gate bus line 26 functions as a scanning line, on which a gate insulating film 27a made of, for example, tantalum oxide ($Ta_2O_5$) is disposed. On the entire surface of the gate insulating film 27a is disposed a gate insulating layer 27b made of, for example, silicon nitride (SiNx), and are patterned semiconductor layers 28a and 28b made of intrinsic amorphous silicon (a-Si) or the like and etching stoppers 29a and 29b made of silicon nitride or the like in that order, the semiconductor layers 28a and 28b functioning as channel layers, respectively.

On the semiconductor layers 28a and 28b and etching stoppers 29a and 29b are formed semiconductor layers 30a and 30b and 31a and 31b made of n-type amorphous silicon or the like for obtaining a good ohmic contact. On the semiconductor layers 30a, 30b, 31a, and 31b are formed source electrodes 33a and 33b and drain electrodes 34a and 34b, respectively. A source bus line 35 that is used as a signal line is patterned simultaneously with the source electrode 33a.

As shown in FIG. 1, in the display electrode substrate 21, two TFTs 20a and 20b corresponding to one picture element electrode 22 are disposed on a gate bus line 26. The source electrodes 33a and drain electrode 34a at the first TFT 20a are positioned perpendicularly to the lengthwise direction of the gate bus line 26 and extend reversely to each other with respect to the gate bus line 26, and thus the channel direction of the first TFT 20a is perpendicular to the extending direction of the gate bus line 26. The source electrode 33a is one with the source bus line 35 and a wiring 43; namely the source electrode 33a is connected to the source bus line 35 by means of the wiring 43 extending from the source bus line 35 in a direction that is parallel to the gate bus line 26.

The source electrode 33b and drain electrode 34b of the second TFT 20b are positioned perpendicularly to the lengthwise direction of the gate bus line 26 and extend reversely to each other with respect to the gate bus line 26. Accordingly, the channel direction of the second TFT 20b is perpendicular to the extending direction of the gate bus line 26. The source electrode 33b is one with the drain electrode 34a and wiring 44; namely, the source electrode 33b is connected to the drain electrode 34a at the first TFT 20a by means of a wiring 44 disposed in a direction parallel to the gate bus line 26. The drain electrodes 34b at the second TFT 20b is connected to the picture element electrode 22 disposed below the TFTs 20a and 20b in FIG. 1.

Figure 9:
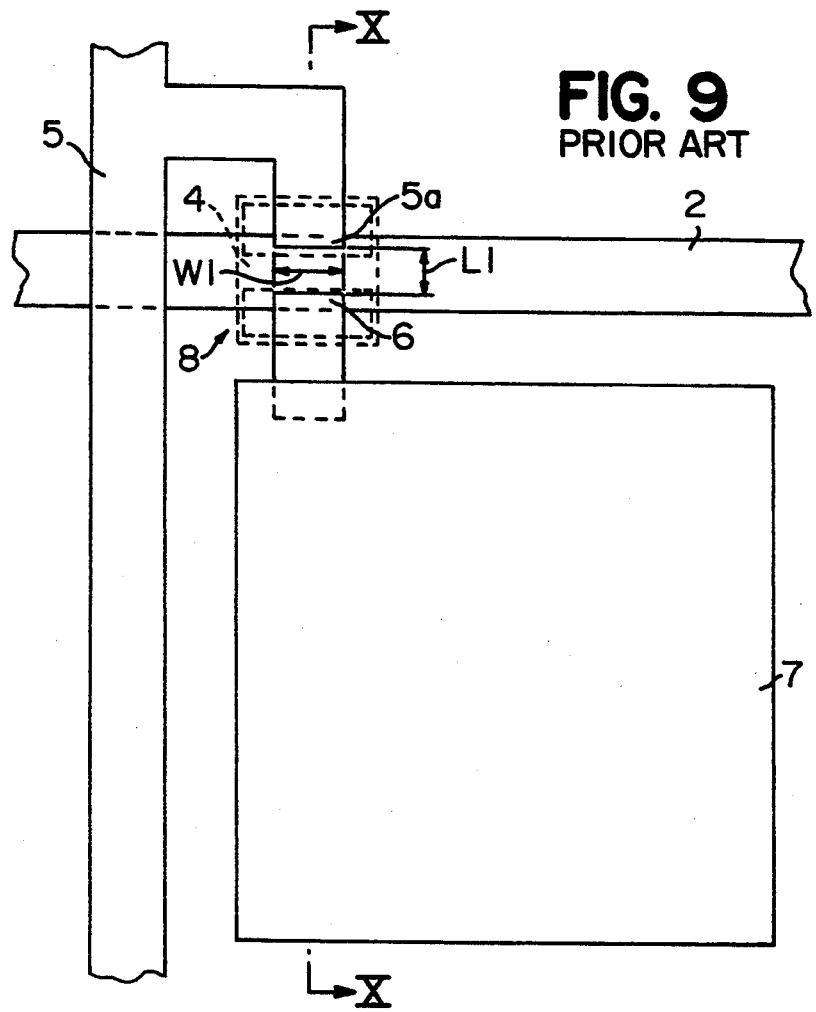
FIG. 9 is a plan view showing a portion of a conventional display electrode substrate that does not have a redundant structure.
Figure 10:
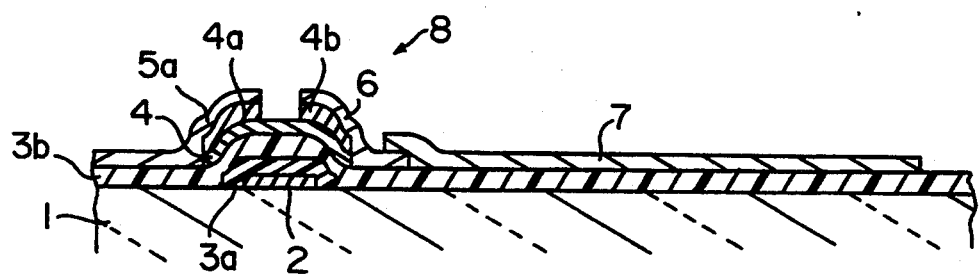
FIG. 10 is a sectional view taken along the line X—X of FIG. 9.
Figure 11:
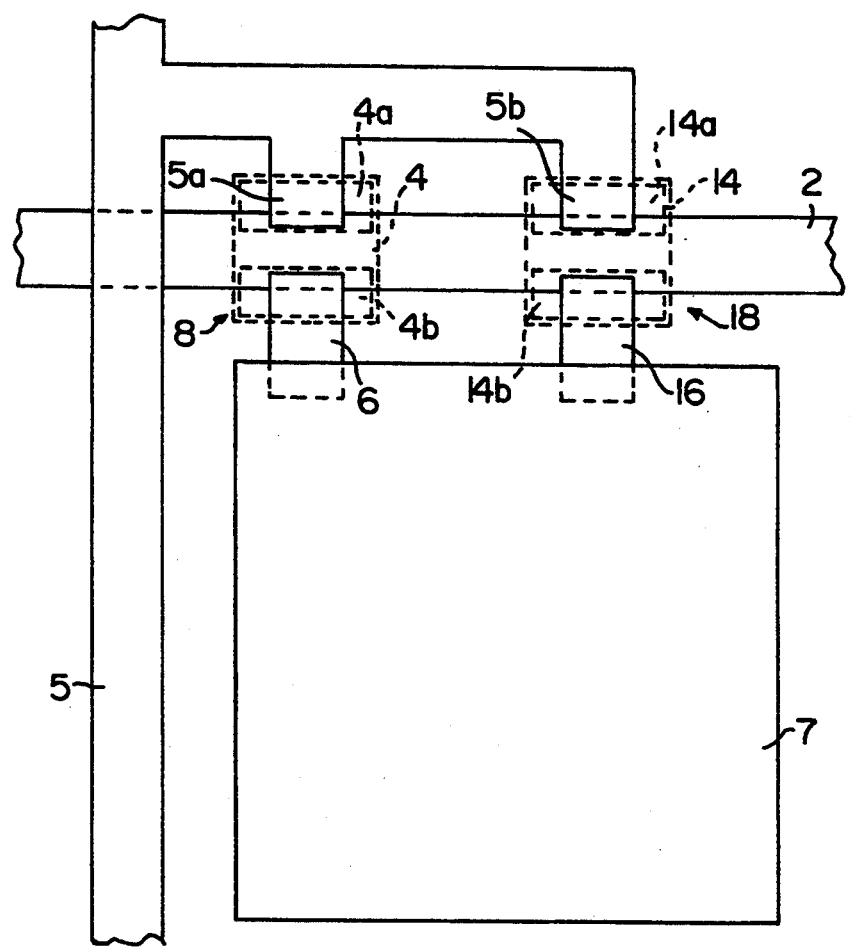
FIG. 11 is a plan view showing a portion of another display electrode substrate with a redundant structure.

With the above-mentioned display electrode substrate 21, the electrical characteristics of the respective TFTs 20a and 20b depend upon configurations of channel regions formed between the source electrodes 33a and the drain electrode 34a and between those 33b and 34b. In other words, as shown in FIG. 1, when the width of the source electrode 33a and drain electrode 34a and the width of the source electrode 33b and drain electrode 34b are represented by channel widths W1a and W1b, respectively, and the distance between the source electrode 33a and the drain electrode 34a and the distance between the source electrode 33b and the drain electrode 34b are represented by channel lengths L1a and L1b, respectively, the electrical characteristics of the TFTs 20a and 20b significantly depend upon the ratios of W1a/L1a and W1b/L1b. In the present embodiment, the TFTs 20a and 20b are connected in series, and in order that, for example, the electrical characteristics of the two TFTs 20a and 20b in combination are coincident with those of the TFT 8 at the display electrode substrate described with reference to FIG. 9, the channel widths W1a and W1b and channel lengths L1a and L1b are set to satisfy the relation given in the following equation:

$$L1a/W1a + L1b/W1b = L1/W1 \quad (1)$$

The channel lengths L1a and L1b depend upon the width of the Gate bus line 26, and thus, when L1=L1a=L1b and moreover W1a=W1b are set, the channel widths W1a and W1b are given in the following formula:

$$W1a = W1b = 2 \cdot W1 \quad (2)$$

In the active matrix type display apparatus using the above-mentioned display electrode substrate 21, a gate voltage applied to the gate bus line 26 switches on and off between the source electrode 33a and the drain electrode 34a and between the source electrode 33b and the drain electrode 34b. For example, when the gate bus line 26 is switched from a non-selection state to a selection state, current fed from the source bus line 35 flows to the picture element electrode 22 passing through the TFTs 20a and 20b. An opposite electrode is provided opposite to the picture element electrode 22 to sandwich a liquid crystal layer (not shown) therebetween, resulting in a capacitor. Accordingly, the capacitor is charged by the electric charge from the source bus line 35 and voltage by the charge is applied to the liquid crystal layer positioned between the opposite electrode and the picture element electrode 22, thereby changing optical characteristics of the liquid crystal layer. Hence, the light transmittance of the corresponding picture element at the active matrix display apparatus changes due to the change in the optical characteristics, thereby performing a desired display.

Figure 4:
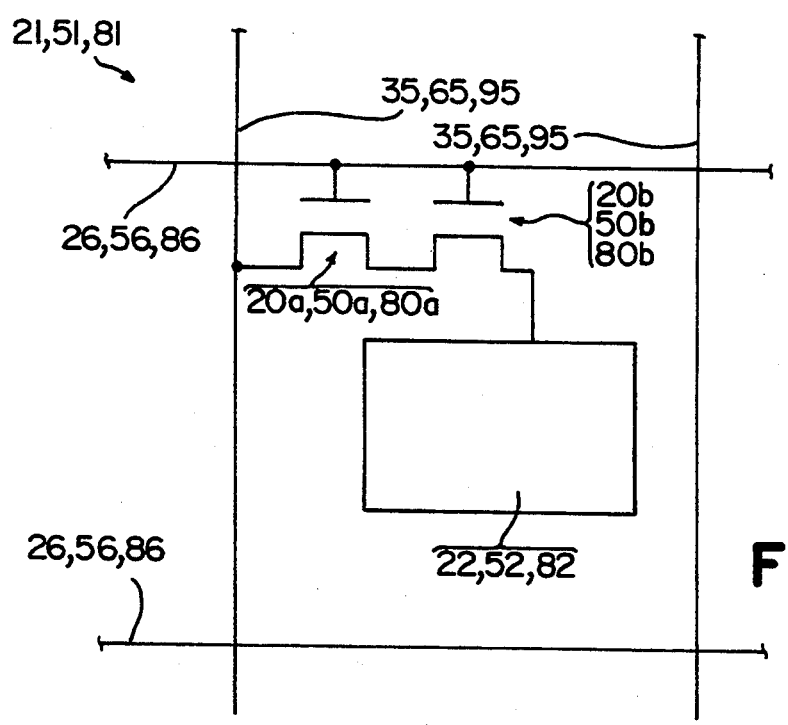
FIG. 4 is an equivalent circuit of a portion corresponding to one picture element of the display electrode substrate of the present invention.

FIG. 4 shows the equivalent circuit of a portion corresponding to one picture element of the display electrode substrate 21. As shown in FIG. 4, since two TFTs 20a and 20b are connected in series, even when one of the TFTs has a short-circuit defect, the other performs a normal switching operation, so that electric charge is normally supplied to the picture element electrode 22 corresponding to the TFTs is properly given electric charge and stored into the capacitor. Accordingly, the picture element corresponding to such a picture element electrode 22 does not become defective. Moreover, as shown in FIG. 1, the two TFTs 20a and 20b are juxtaposed on the same gate bus line 26 in the present embodiment, the area of the picture element electrode 22 is never reduced. In this way, the active matrix liquid crystal display apparatus using the display electrode substrate 21 can remarkably improve its display quality and production yield thereof.

EXAMPLE 2

FIG. 5 shows another display electrode substrate 51 of the invention used for the active matrix display apparatus, and FIG. 6 is a sectional view taken on the line VI—VI in FIG. 5.

The display electrode substrate 51 is manufactured in the same process as that of the aforesaid display electrode substrate 21 except for the patterning. On a glass substrate 55 are provided a gate bus line 56, gate insulating films 57a and 57b, semiconductor layers 58a, 60a, 61a, 58b, 60b and 61b, and the like.

At the display electrode substrate 51, first and second TFTs 50a and 50b corresponding to one picture element electrode 52 are connected in series on a gate bus line 56. A source electrode 63a at the first TFT 50a is one with a source bus line 65 and a wiring 73; namely, the source electrode 63a is connected to the source bus line 65 by means of the wiring 73 extending from the source bus line 65 in a direction parallel to the gate bus line 56. A drain electrode 64b at the second TFT 50b is connected to the picture element electrode 52 disposed below the TFTs 50a and 50b in FIG. 5.

An electrode 62 that is disposed on a portion of the gate bus line 56 serves as the drain electrode 61a at the first TFT 50a and the source electrode 60b at the second TFT 50b. The equivalent circuit of the display electrode substrate 51 is shown in FIG. 4, the display electrode 51 operating in the same way as that of the aforesaid display electrode substrate 21.

The channel direction of the respective TFTs 50a and 50b is parallel to the gate bus line 56. The channel widths W2a and W2b of the TFTs 50a and 50b depend upon the width of the gate bus line 56, but the channel lengths L2a and L2b of the same can freely be set without increasing an area required for an electric wiring, so that the TFTs 50a and 50b having desired electrical characteristics can be formed without reducing an area of picture element electrode 52. Therefore, the picture element defect caused by short-circuit of TFTs 50a and 50b is prevented and the effective area of the picture element electrode 52 is increasable, thereby improving the display quality of the display apparatus. Moreover, the display apparatus using the display electrode substrate 51 can expect high precision of image.

EXAMPLE 3

Figure 7:
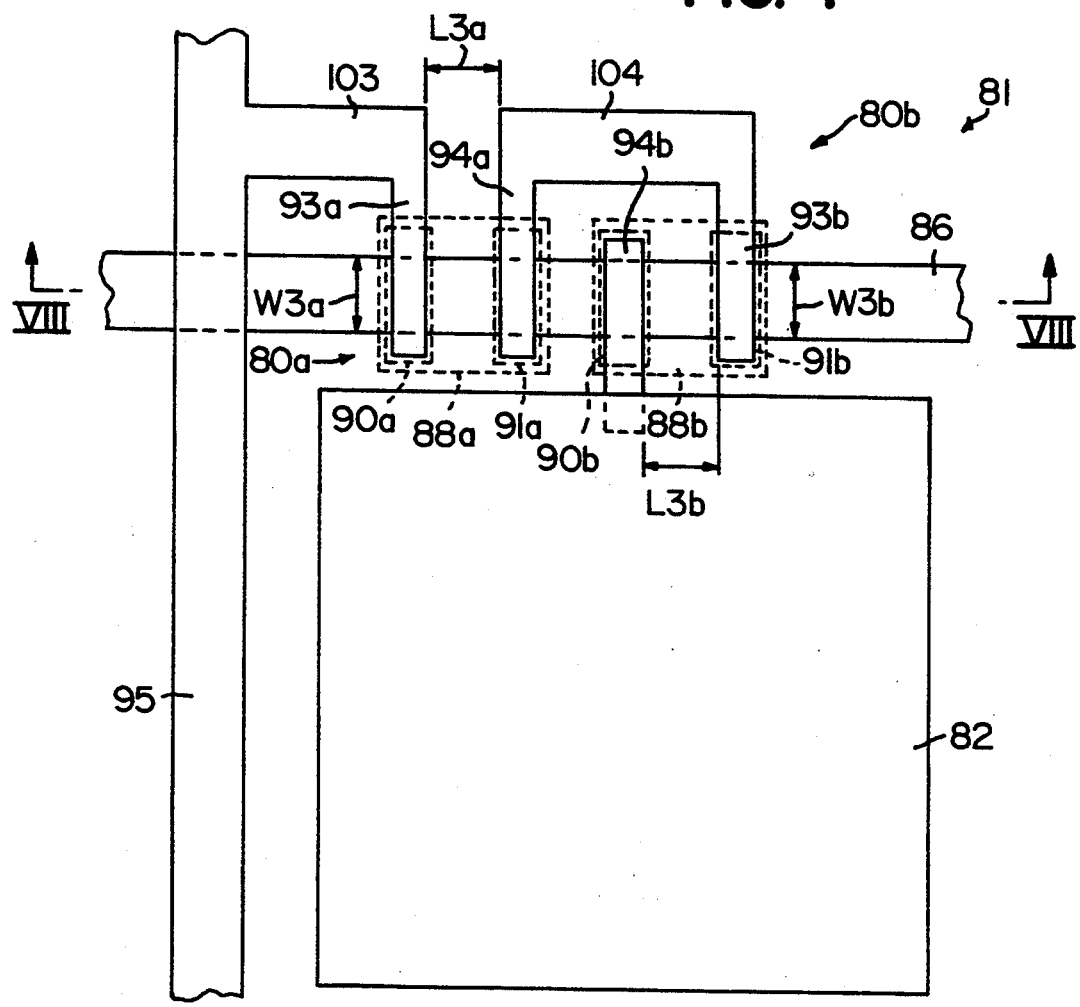
FIG. 7 is a plan view showing a portion of still another display electrode substrate of the present invention.
Figure 8:
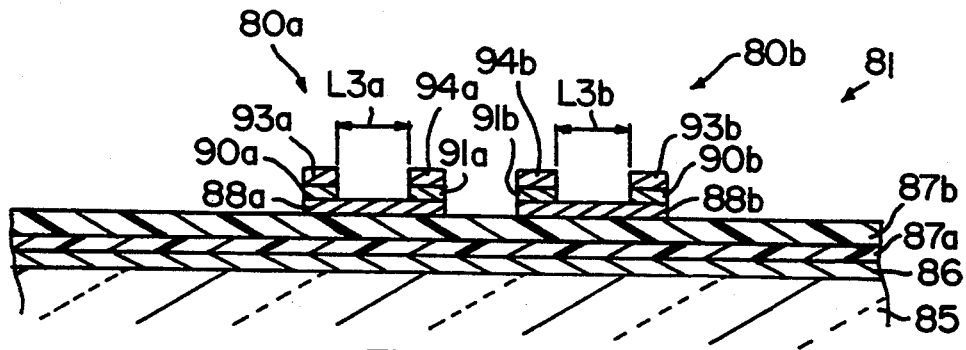
FIG. 8 is a sectional view taken along the line VIII—VIII of FIG. 7.

FIG. 7 shows still another display electrode substrate 81 of the invention used for the active matrix liquid crystal display apparatus, and FIG. 8 is a sectional view taken on the line VIII—VIII in FIG. 7.

The display electrode substrate 81 is manufactured, by the same process as the aforesaid display electrode substrate 21 except for the patterning. On a glass substrate 85 are provided a gate bus line 86, gate insulating films 87a and 87b, semiconductor layers 88a, 90a, 91a, 88b, 90b and 91b, and the like.

At the display electrode substrate 81, first and second TFTs 80a and 80b corresponding to one picture element electrode 82 are disposed in series on a gate bus line 86. A source electrode 93a at the first TFT 80a is one with a source bus line 95 and a wiring 103; namely, the source electrode 93a is connected to the source bus line 95 by means of the wiring 103 extending from the source bus line 95 in a direction that is parallel to the gate bus line 86.

A source electrode 93b at the second TFT 80b is one with a drain electrode 94a of the first TFT 80a and a wiring 104; namely, the source electrode 93b is connected to the drain electrode 94a at the first TFT 80a by means of the wiring 104 disposed parallel to the gate bus line 86. A drain electrode 94b at the second TFT 80b is connected to a picture element 82 disposed below the TFTs 80a and 80b in FIG. 7. The channel directions of the first and second TFTs 80a and 80b are parallel to the extending direction of the gate bus line 86. The equivalent circuit of the display electrode substrate 81 is shown in FIG. 4, the substrate 81 operating in the same way as that of the aforesaid display electrode substrates 21 and 51.

At the display electrode substrate 81, since the TFTs 80a and 80b are juxtaposed on the gate bus line 86, an area required for a wiring does not increase for the same reasons as those of the aforesaid display electrode substrate 51. Accordingly, the effective area of the picture element electrode 82 is increasable and its display quality is improvable. Moreover, with the two TFTs 80a and 80b at the display electrode substrate 81, the wiring 104 connected to the drain electrode 94a is connected to the source electrode 93b in a manner to extend round the drain electrode 94b at the TFT 80b, so that the semiconductor layers 88a and 88b are completely separated from each other, thereby enabling the TFTs 80a and 80b to reliably operate and attaining an improvement of reliability thereof.

As mentioned above, the display electrode substrate is provided with a lengthy construction in which two TFTs are connected in series, whereby the picture element defect caused by a short-circuit at the TFTs is prevented and the production yield of the display electrode substrate is improved.

Although these embodiments disclose that two TFTs are disposed on the gate bus line which is used as the gate electrode, the number of TFTs connected in series is not be limited thereto. Moreover, it is possible that a plurality of TFTs connected in series are connected in parallel.

As seen from the above, according to the present invention, a plurality of TFTs are connected in series to each picture element electrode, so that the electric charge is supplied to the picture element electrode and stored in the capacitor even when some of the TFTs cause a short-circuit defect. Accordingly, the picture element defect caused by a short-circuit at the TFTs can be remarkably reduced.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A display electrode substrate comprising a large number of picture element electrodes disposed in a matrix form on an insulating substrate, at least two, first and second, thin film transistors connected to each of said picture element electrodes, gate bus lines provided in parallel to each other between said picture element electrodes, and source bus lines intersecting with said gate bus lines respectively, wherein said first and second thin film transistors are juxtaposed on the same one of said gate bus lines and are connected in series, part of said gate bus line functions as gate electrodes of said first and second thin film transistors, a source electrode of said first thin film transistor is connected to said source bus line, a drain electrode of said first thin film transistor is connected to a source electrode of said second thin film transistor, and a drain electrode of said second thin film transistor is connected to said picture element electrode, and further wherein said drain electrode at said first thin film transistor and said source electrode at said second thin film transistor are positioned in a first row along a longitudinal direction of said gate bus line, and said source electrode at said first thin film transistor and said drain electrode at said second thin film transistor are disposed in a second row along the longitudinal direction of said gate bus line.

2. A display electrode substrate comprising a large number of picture element electrodes disposed in a matrix form on an insulating substrate, at least two, first and second, thin film transistors connected to each of said picture element electrodes, gate bus lines provided in parallel to each other between said picture element electrodes, and source bus lines intersecting with said gate bus lines respectively, wherein said first and second thin film transistors are juxtaposed on the same one of said gate bus lines and are connected in series, part of said gate bus line functions as gate electrodes of said first and second thin film transistors, a source electrode of said first thin film transistor is connected to said source bus line, a drain electrode of said first thin film transistor is connected to a source electrode of said second thin film transistor, and a drain electrode of said second thin film transistor is connected to said picture element electrode, said source electrode and drain electrode at said first thin film transistor are disposed in a row along a longitudinal direction of said gate bus line, and said source electrode and drain electrode at said second thin film transistor are also disposed in said row.

and further wherein said first and second thin film transistors are placed along said gate bus line in such a way as to have said drain electrode of said first thin film transistor situated next to said drain electrode of said second thin film transistor.

* * * * *

UNITED STATES PATENT AND TRADEMARK OFFICE
CERTIFICATE OF CORRECTION

PATENT NO. : 5,410,164
DATED : April 25, 1995
INVENTOR(S) : Mikio Katayama et al It is certified that error appears in the above-indentified patent and that said Letters Patent is hereby corrected as shown below:

```
Title Page, item # [73]: reads "Sharp Kabushimi Kaisha",
      should read: --Sharp Kabushiki Kaisha--;
in the ABSTRACT, line 1: reads "elect:rode",
      should read --electrode--;
in the ABSTRACT, line 4: reads "Juxtaposed",
      should read --juxtaposed--;
in column 2, line 6: reads "having]such",
      should read: --having such--;
in column 2, line 19: reads "has-been",
      should read --has been--;
in column 5, line 32: reads "Gate",
      should read --gate--;
In column 6, line 63: reads "manufactured,"
      should read --manufactured--.
```

Signed and Sealed this

Fifth Day of December, 1995

Attest:

BRUCE LEHMAN

*Attesting Officer*   Commissioner of Patents and Trademarks